United States Patent [19]
Higgins, Jr.

[11] Patent Number: 5,363,074
[45] Date of Patent: Nov. 8, 1994

[54] SAW STRUCTURE HAVING SERIALLY COUPLED TRANSDUCERS WITH OVERLAPPING FINGERS

[75] Inventor: Robert J. Higgins, Jr., Plantation, Fla.

[73] Assignee: Motorola, Inc., Schaumburg, Ill.

[21] Appl. No.: 963,190

[22] Filed: Oct. 19, 1992

[51] Int. Cl.[5] .............................................. H03H 9/64
[52] U.S. Cl. ................... 333/195; 310/313 B; 310/313 D
[58] Field of Search ............... 333/193, 195, 153, 154; 310/313 R, 313 B, 313 C, 313 D

[56] References Cited

U.S. PATENT DOCUMENTS

| 3,675,054 | 7/1972 | Jones et al. | 310/313 B |
| 3,801,935 | 4/1974 | Mitchell | 333/193 |
| 4,223,284 | 9/1980 | Inoue et al. | 333/196 X |
| 4,321,567 | 3/1982 | Sandy | 333/196 |
| 4,384,264 | 5/1983 | Kadota | 333/154 X |
| 4,494,031 | 1/1985 | Barnes et al. | 310/313 R X |
| 4,635,008 | 1/1987 | Solie | 333/195 |

FOREIGN PATENT DOCUMENTS 153318 9/1984 Japan .................... 333/193

OTHER PUBLICATIONS

Lakin, Kenneth, et al.; "A New Interdigital Electrode Transducer Geometry" *IEEE Trans on Microwave Theory & Techniques;* vol. MTT 22; No. 8; Aug. 1974; pp. 763–768.

Primary Examiner—Benny Lee
Attorney, Agent, or Firm—Daniel K. Nichols; Andrew S. Fuller

[57] ABSTRACT

A SAW resonator/filter structure (300) includes a transducer portion. The transducer portion includes a plurality of acoustically coupled sub-transducer portions (310 and 312) comprising conductive patterns having interdigitated open-ended fingers. The sub-transducer portions (310 and 312) are electrically coupled to each other in series in order to increase the port impedance of the SAW filter structure (300) while providing the widest bandwidth.

4 Claims, 3 Drawing Sheets

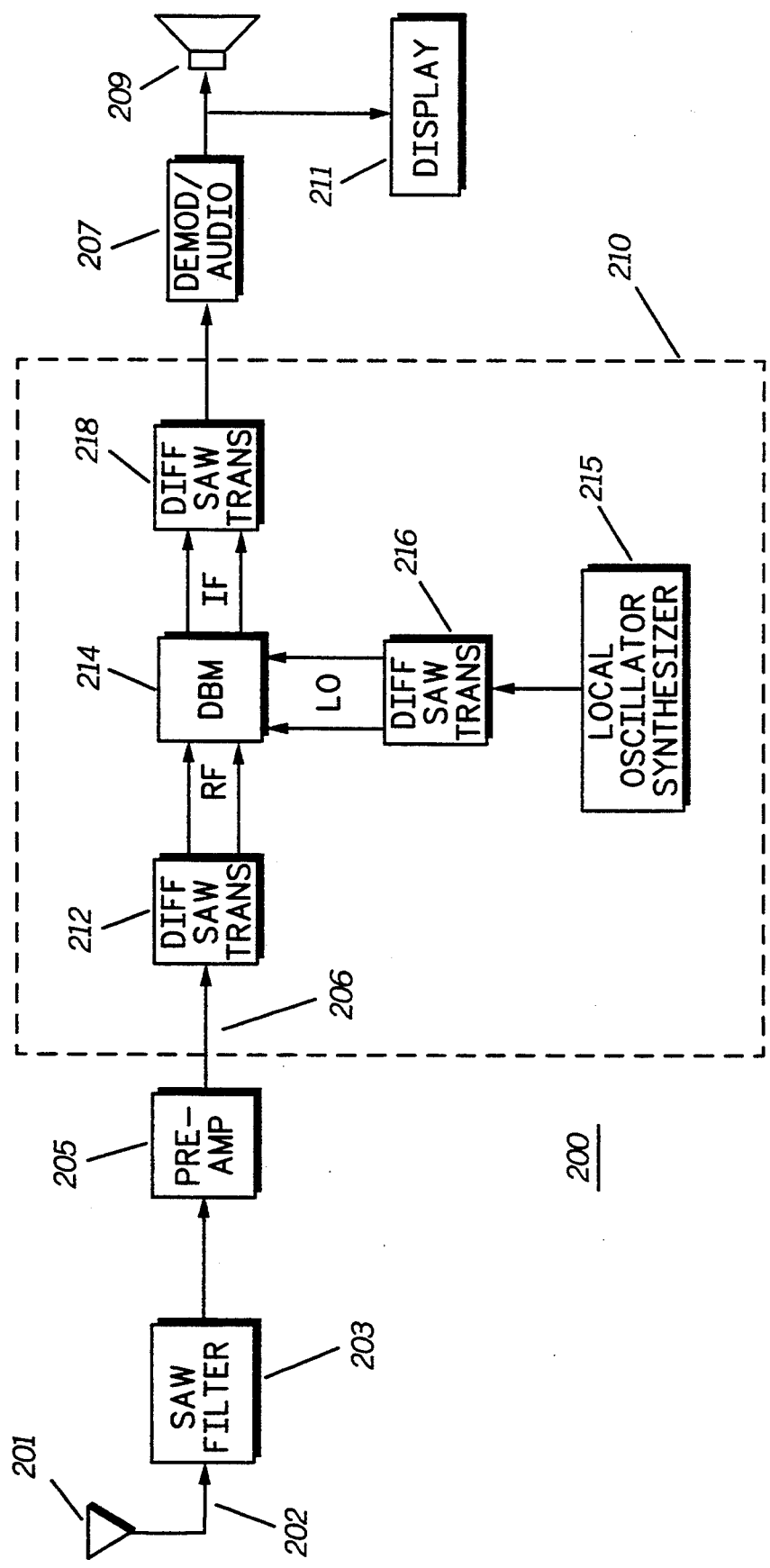

SAW STRUCTURE HAVING SERIALLY COUPLED TRANSDUCERS WITH OVERLAPPING FINGERS

CROSS REFERENCE TO RELATED APPLICATIONS

This application is being cross-referenced to co-pending U.S. patent application Ser. No. 963,191, filed Oct. 15, 1992, by Higgins, and assigned to Motorola, Inc.

TECHNICAL FIELD

This invention relates generally to Surface Acoustic Wave (SAW) structures and more particularly to a SAW resonator structure used in radio frequency communication.

BACKGROUND

SAW components use acoustic waves which travel at the speed of sound. The SAW components are preferred over widely used transmission line components because acoustic waves have a substantially shorter wave length at operating frequency than electromagnetic waves which travel at the speed of light. Therefore, for a given operating frequency, a SAW resonator filter provides a smaller sized structure than a transmission line structure, therefore, making them suitable for miniaturized radio frequency applications. Furthermore, SAW structures are easily integratable with other active circuits such as amplifiers and mixers which are produced using conventional integrated circuit technologies.

For the above reasons, the popularity of SAW structures in radio frequency applications has been steadily increasing, especially in resonator filter applications. FIG. 1 depicts the diagram of a conventional SAW resonator filter structure 100 which includes a SAW transducer 110, a pair of reflectors 120, and a piezoelectric substrate 105. The SAW filter structure 100 is connected to a voltage source Vs having a resistive load Rs. The SAW transducer 110 comprises a first electrode 112 having a first set of open-ended fingers 114 and a second electrode 116 having a second set of open-ended fingers 118. The first electrode 112 and the second electrode 116 comprise conductive layers patterned on the piezoelectric substrate such that a first set of fingers 114 and a second set of fingers 118 are interdigitated in relation to each other, as illustrated.

Conventional SAW resonator filters have an inherently narrow bandwidth when designed for resistive termination. The bandwidth is limited because of the low piezoelectric coupling coefficient of most substrates. However, in some radio frequency applications, such as those used for receiver selectivity, a substantially wide bandwidth is desired. In order to achieve the widest possible bandwidth, it is necessary to provide large numbers of fingers in the SAW transducer 110. It is well known that the widest bandwidth is achieved with a resistive source load Rs whose resistance is equal to the capacitive reactance at the operating frequency of the capacitors formed by the interdigitated fingers 114 and 118. As the number of interdigitated fingers increases for achieving the widest bandwidth, so does the interdigital capacitance between the electrodes 112 and 116, thereby reducing the optimum termination resistance. However, when the SAW structure terminates an active stage, it is very desirable to have a high termination impedance in order to realize high gains utilizing very little bias current drain. The current drain is an important parameter in miniaturized receivers where SAW structures are used. Therefore, it is desired to achieve the widest bandwidth in a SAW filter structure while presenting a sufficiently high termination impedance.

SUMMARY OF THE INVENTION

Briefly, according to the invention, there is provided a surface acoustic wave structure including a piezoelectric substrate having a single port SAW transducer disposed thereon. The SAW transducer includes a plurality of acoustically coupled sub-transducers, each sub-transducer having a pair of electrodes with interdigitated fingers. The electrodes are connected to each other such that a serial electrical connection between the sub-transducers is provided.

BRIEF DESCRIPTION OF THE DRAWINGS

FIG. 5 is a block diagram of a radio which utilizes the SAW structure of the invention.

DETAILED DESCRIPTION OF THE PREFERRED EMBODIMENT

Figure 2:
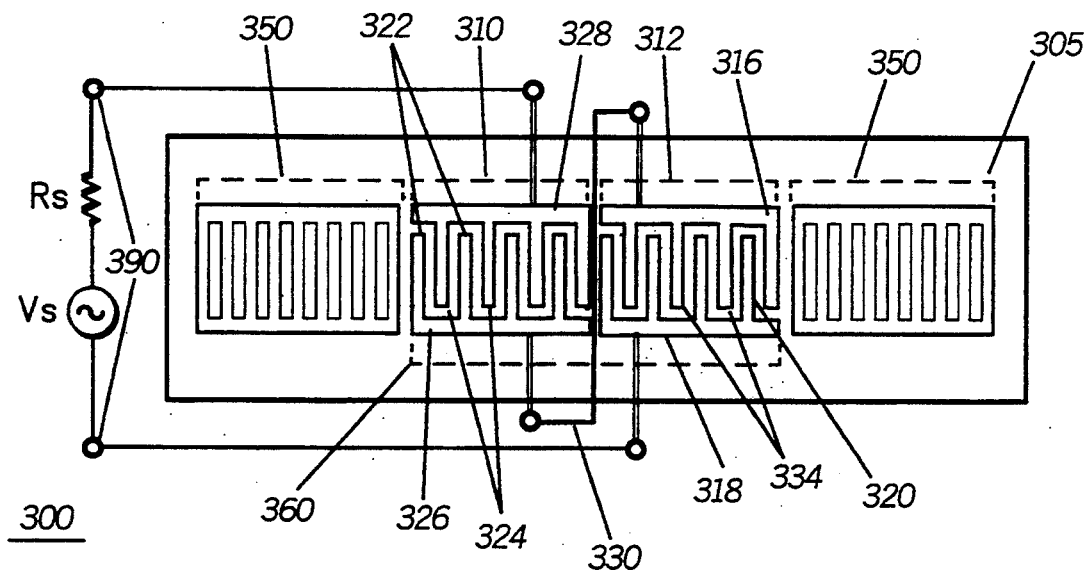
FIG. 2 is a top plan view of one embodiment of the SAW structure having a plurality of serially coupled sub-transducers.

Referring to FIG. 2, a top plan view of a SAW structure 300 is shown. The SAW structure 300 is a bandpass filter having a frequency response optimized to provide the widest bandwidth. The widest bandwidth is provided when the reactance presented by the SAW filter transducer electrodes equals the source load Rs. As described hereinbefore, one of the objectives of the present invention is to provide the widest bandwidth while providing a high termination impedance at the filter's port 390. The SAW filter 300 includes a piezoelectric substrate 305 upon which a plurality of conductive patterns forming a single port transducer portion 360 and reflector portions 350 are disposed. As illustrated, the transducer portion 360 is centrally positioned between the reflector portions 350 and has a termination port comprising a pair of terminals. The reflectors 350 are formed by patterning a plurality of equally spaced, parallel conductive traces which at each end are consecutively shorted to each other. The transducer portion 360 also is made of conductive patterns which include equally spaced open-ended fingers. The substrate 305 is made of suitable piezoelectric material, such as quartz, lithium niobate, or lithium tantalate, which, along with the spacing of the open-ended fingers, provide appropriate properties for producing the desired frequency response.

According to the invention, the transducer portion 350 includes a plurality of sub-transducers which are electrically coupled to each other in series. In this way, the termination impedance of the SAW filter 300 is increased without affecting the composite number of open-ended fingers for achieving the widest bandwidth. The principal concept of the present invention is substantially analogous to dividing the transducer 110 of the prior art structure 100 (shown in FIG. 1) into a predetermined number of (N) electrically separate but acoustically synchronous sub-transducers and, then, electrically coupling the sub-transducers in series. As a result, the termination impedance is increased by a factor which is the square of the number of divisions when compared to the original termination impedance of the prior art structure, that is, the SAW structure 100. In this way, compared to the original termination impedance, that is, that of the SAW filter 100, the resulting termination impedance is increased by square of the number of divisions ($N^2$). The termination impedance of the SAW structure 300 as compared to that of structure 100 is increased because the source voltage Vs gets divided across the N sub-transducers providing a Vs/N potential across each. Additionally, since the capacitance of each section is C/N, the reactance of each sub-transducer is N times the reactance $X_{100}$ of the transducer 110 of SAW structure 100. Therefore, the resulting current through each transducer is $Vs/X_{100}/N^2$, which translates into a $1/N^2$ termination impedance increase compared to the SAW structure 100.

As shown in FIG. 2, two serially coupled sub-transducers 310 and 312 are formed within transducer portion 360. The sub-transducers 310 and 312 are acoustically coupled to each other and to the reflectors 350 which are positioned adjacent to them. The sub-transducer 310 has a first pair of electrodes comprising conductive patterns 328 and 326, and the sub-transducer 312 has a second pair of electrodes comprising the conductive patterns 316 and 318.

The electrode 328 is patterned to have a plurality of open-ended fingers 324 which are consecutively shorted to each other at one end and remain unconnected at the other end. The electrode 326 is patterned to have a plurality of open-ended fingers 322 such that the open-ended fingers 324 and 322 are interdigitated. Similarly, the sub-transducer 312 is formed adjacent to the sub-transducer 310 by interdigitating the open-ended fingers 334 and 320 of the electrodes 316 and 318.

The term electrode, as described herein, defines an electrically isolated conductor disposed on piezoelectric substrate 305, optionally connected to an external circuit. In the SAW filter structure 300, when an alternating electrical voltage is applied between the electrodes 328 and 326, a corresponding acoustic wave is induced. The acoustic wave so induced travels on or near the surface of the substrate 305. The same phenomena occurs across the electrodes 316 and 318 of the sub-transducer 312 for converting electrical signals to acoustical waves and vice versa. Serial connection between the sub-transducers 310 and 312 is produced by electrically coupling the electrode 326 to the electrode 316 with an electrical conductor 330, such that the alternating current flowing from the electrode 328 to electrode 326 also flows directly from the electrode 316 to the electrode 318.

Figure 1:
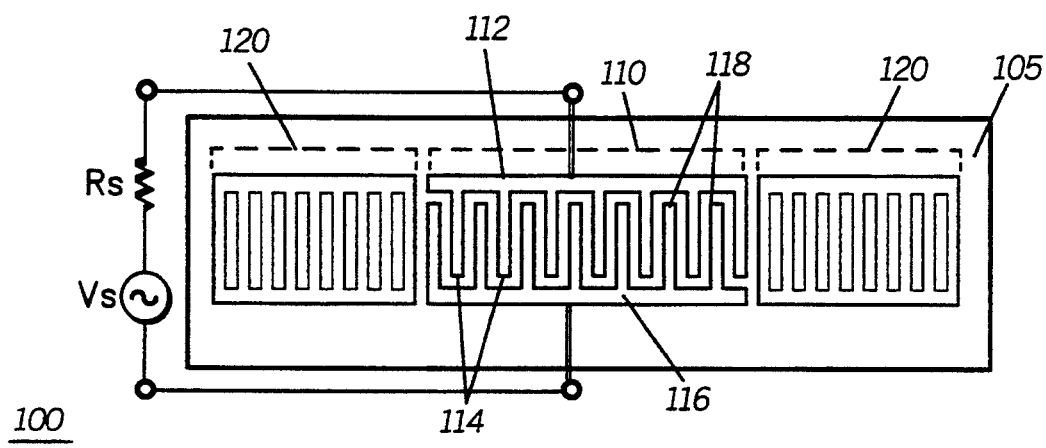
FIG. 1 depicts a diagram of a prior art SAW filter structure.
Figure 3:
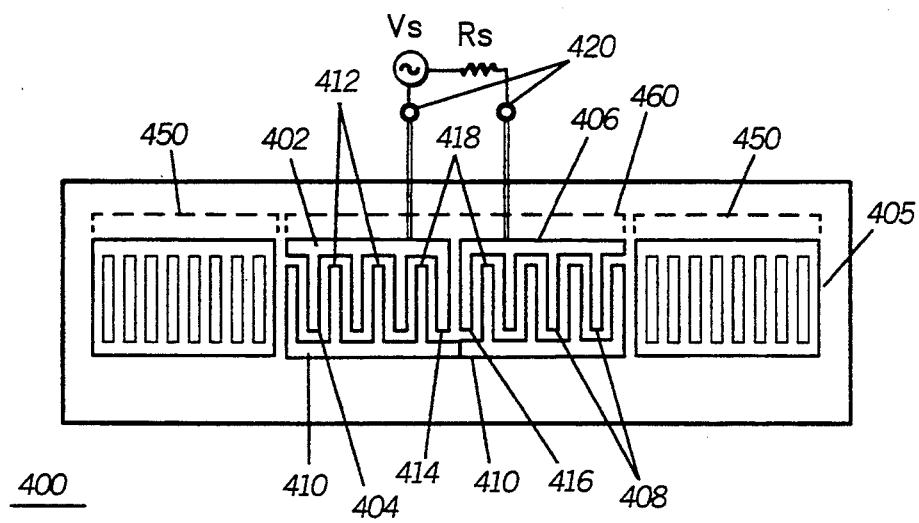
FIG. 3 is a second embodiment of the serially coupled sub-transducers of FIG. 2.

Referring to FIG. 3, the top plan view of a SAW filter structure 400, which is substantially equivalent to the SAW filter 300 of FIG. 1, is shown. As in FIG. 2, the SAW filter structure 400 is electrically coupled to a voltage source Vs having a resistive source load Rs. As described later in detail, the SAW structure 400 is produced by inverting electrodes of the sub-transducer 312 (i.e., electrodes 316 and 318) of FIG. 2 and providing a direct electrical connection between the serially connected sub-transducers via a single and continuous conductive pattern 410 which embodies the directly-connected electrodes 326 and 316 of FIG. 2.

In this embodiment, the SAW filter 400 includes a single port transducer portion 460 and the reflectors 450 disposed on a piezoelectric substrate 405. The transducer has a single port comprising two terminals 420. The transducer portion 460 includes a first conductive pattern 402 corresponding to the electrode 322 of FIG. 2 which has a plurality of equally-spaced, open-ended fingers 404 and a second conductive pattern 406 having equally-spaced fingers 408. The transducer portion 460 also includes the continuous conductive pattern 410 comprising a third conductive pattern which has a plurality of open-ended fingers 412. The continuous third conductive finger 410 includes two contiguous first and second portions (as delineated by the dotted line) corresponding to the electrodes 324 and 316 of FIG. 2. As illustrated, the open-ended fingers 404 of the first conductive pattern 402 are interdigitated with at least some of the open-ended fingers of the third conductive pattern 410, and the open-ended fingers 408 of the second conductive pattern 406 are interdigitated with at least some of the other open-ended fingers of the third conductive pattern 410. Preferably, the center-to-center distances between adjacent interdigitated fingers equal quarter wave length of the desired frequency.

In this arrangement, the first conductive pattern 402 corresponds to the electrode 328 of FIG. 2 and provides one of the terminals 420 of the single port SAW structure 400. The third conductive pattern 410 corresponds to the electrode 316 of FIG. 2 which is inverted and directly coupled to the electrode 314 along a straight line. Similarly, the second conductive pattern 406 corresponds to the electrode 318 as inverted to provide the other terminal 420 of the single port transducer 460. As a result of simultaneous inverting of the electrodes 318 and 316, the outermost finger 414 of the first conductive pattern 402 and the outermost finger 416 of the second conductive pattern 406 is positioned between a pair of open-ended fingers 418 of the third conductive pattern 410. Advantageously, terminals 420 of the single port SAW transducer 400 are positioned on the same side, thereby allowing convenient connection to an external source.

The port impedance of a SAW structure may be further increased by increasing the number of serially connected sub-transducers of the transducer portion.

Figure 4:
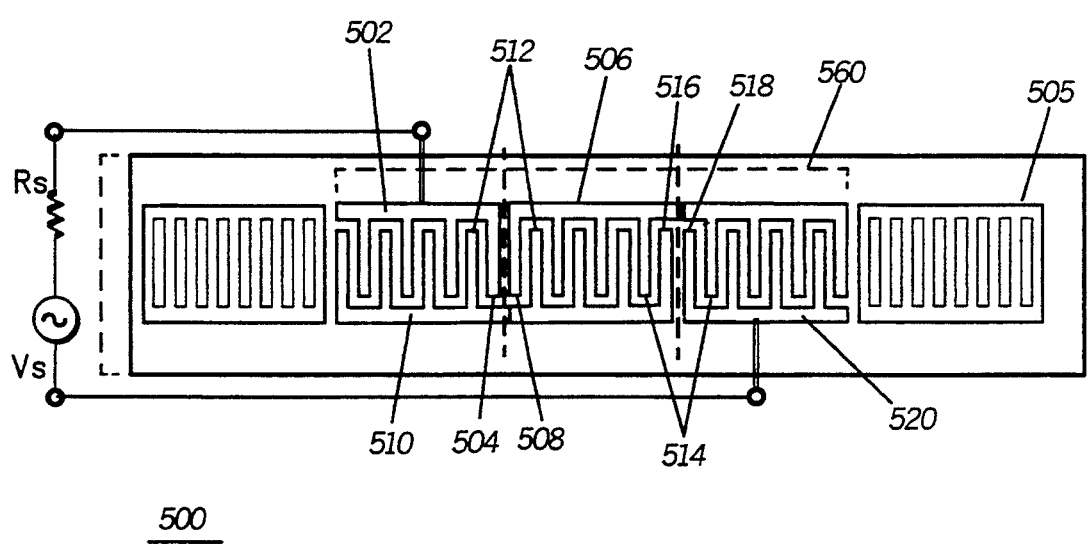
FIG. 4 is a top plan view of a third embodiment of the SAW structure having a plurality of serially coupled sub-transducers.

Referring to FIG. 4, a single port SAW structure 500 is shown whose transducer portion 560 comprises three serially connected sub-transducers (delineated by dotted lines) which are coupled to each other as described above. As in FIG. 2, the SAW filter structure 500 is electrically coupled to a voltage source Vs having a resistive source load Rs. The transducer portion 560 includes conductive patterns 502, 506, 510, and 520 disposed on a piezoelectric substrate 505. As illustrated, the outermost finger 504 of the conductive pattern 502 and the outermost finger 508 of the conductive pattern 506 are disposed between a pair of adjacent fingers 512 of the conductive pattern 510. Also, an outermost finger 516 of the conductive pattern 510 is positioned adjacent an outermost finger 518 of the conductive pattern 520, both of which are positioned between a pair of adjacent fingers 514 of the second conductive pattern 506. As explained above in the arrangement of FIG. 2, the port impedance of the SAW structure 500 is nine times higher than that of the SAW structure 100 of FIG. 1. However, as it may be seen, when an odd number of sub-transducers are serially coupled to each other, the port terminals become positioned at the opposing sides of the transducer 560.

Referring to FIG. 5, a block diagram of a receiver 200, which includes the surface acoustic wave structure of the present invention, is shown. The receiver 200 is an FM receiver which operates in a well-known manner to receive communication signals directed to a communication device such as a small paging unit. Alternatively, the receiver 200, when combined with a transmitter (not shown), provides a transceiver unit for communicating communication signals with another two-way transceiver unit.

The present invention contemplates utilizing surface acoustic wave (SAW) technology for processing the communication signals. The processing of the communication signals includes performing such functions as frequency filtering, phase splitting, and transformation.

In the receiver 200, a radio frequency (RF) signal 202 carrying a communicated message is received via an antenna 201. The RF signal 202 is applied to a filter 203 which comprises a SAW bandpass filter to provide the initial selectivity for the receiver 200. An amplifier 205 amplifies the output of the filter 203 and couples it to an IF stage 210. The IF stage 210 is a balanced IF stage which includes a SAW balanced network which couples to differential input(s) and differential output(s) of the balanced mixer 214. The IF stage 210 includes SAW transformers 212, 216, and 218, as well as a mixer 214. The mixer 214 is double balanced, having a pair of RF inputs, a pair of LO inputs, and a pair of IF outputs. The RF and LO input pairs and the IF output pair comprise balanced differential ports which may receive two differential inputs and provide a single output and vice-versa, that is, receive single input and provide two differential outputs. It may be appreciated that the SAW filter 203 and the amplifier 205 and IF stages transformation and mixer combination may be integrated on a single substrate using both SAW and conventional IC technologies. The SAW transformer 212 receives output of the amplifier 205 at its input and provides outputs which are 180 degrees out of phase with each other. The outputs of the SAW transformer 212 are applied to RF inputs of the mixer 214 which also receives outputs of a SAW transformer 216 at its (local oscillator) LO inputs. The SAW transformer 216 receives a single LO input from a well-known frequency synthesizer 215, generating the local oscillator frequency for the receiver 200. The mixer 214 provides a differential IF output which is applied to differential inputs of the SAW transformer 218. The SAW transformer 218 operates in reverse of the SAW transformers 212 and 216 in that it receives a differential input and provides a single output. The output of the SAW transformer 218, which comprises the IF signal for the receiver 200, is applied to a well-known demodulator/audio circuitry 207 to recover the communicated message. If the communicated message has an audio component, the audio message is rendered audible through a speaker 209. If the communicated message comprises a data message it is displayed via a display device 211.

One of ordinary skill in the art will appreciate that the number of serially connected sub-transducers may be increased by any desired number to achieve a high termination impedance while maintaining the widest bandwidth possible. Where an even number of sub-transducers is serially coupled, the present invention also facilitates interconnection with an external source by providing both terminals of the SAW filter structure at the same side of the transducer portion.

What is claimed is:

1. A radio, comprising:
   a radio receiver means for receiving communication signals, said receiver means including a surface acoustic wave structure, comprising:
   a piezoelectric substrate; and
   a single port SAW transducer having conductive electrode patterns disposed on said piezoelectric substrate, said SAW transducer comprising first, second, and third sub-transducers acoustically coupled in a common acoustic track, wherein:
      the first sub-transducer comprises a first conductive electrode pattern having a first set of open-ended fingers, and a second conductive electrode pattern having a second set of open-ended fingers; the second sub-transducer comprises the second conductive electrode pattern, and a third conductive electrode pattern having a third set of open-ended fingers; and the third sub-transducer comprises the third conductive electrode pattern, and a fourth conductive electrode pattern having a fourth set of open-ended fingers; wherein the first sub-transducer is electrically coupled to the second sub-transducer, and the second sub-transducer is electrically coupled to the third sub-transducer; and wherein at least one of the open-ended fingers of the first conductive pattern and at least one of the open-ended fingers of the third conductive pattern are directly positioned adjacent each other and also positioned between a pair of successive open-ended fingers of the second conductive pattern.

2. The radio of claim 1, wherein said SAW transducer has opposing ends, and said SAW structure further includes a pair of SAW reflectors positioned on opposing the ends of the SAW transducer.

3. A surface acoustic wave structure, comprising:
   a piezoelectric substrate; and
   a single port SAW transducer having conductive electrode patterns disposed on said piezoelectric substrate, said SAW transducer comprising first, second, and third sub-transducers acoustically coupled in a common acoustic track, wherein:
      the first sub-transducer comprises a first conductive electrode pattern having a first set of open-ended fingers, and a portion of a second conductive electrode pattern having a second set of open-ended fingers; the second sub-transducer comprises a portion of the second conductive electrode pattern, and a portion of a third conductive electrode pattern having a third set of open-ended fingers; and the third sub-transducer comprises a portion of the third conductive electrode pattern, and a fourth conductive electrode pattern having a fourth set of open-ended fingers; wherein the first sub-transducer is electrically coupled to the second sub-transducer, and the second sub-transducer is electrically coupled to the third sub-transducer; and wherein at least one of the open-ended fingers of the first conductive pattern and at least one of the open-ended fingers of the third conductive pattern are directly positioned adjacent each other and also positioned between a pair of successive open-ended fingers of the second conductive pattern.

4. The SAW structure of claim 3, wherein said SAW transducer has opposing ends, and said SAW structure further includes a pair of SAW reflectors positioned on the opposing ends of the SAW transducer.

* * * * *